US008436528B2

(12) United States Patent
Gregory et al.

(10) Patent No.: US 8,436,528 B2
(45) Date of Patent: May 7, 2013

(54) ORGANIC ELECTRONIC DEVICE STRUCTURES AND FABRICATION METHODS

(75) Inventors: Haydn Gregory, San Jose, CA (US); Julian Carter, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 155 days.

(21) Appl. No.: 12/063,984

(22) PCT Filed: Aug. 22, 2006

(86) PCT No.: PCT/GB2006/003135
§ 371 (c)(1),
(2), (4) Date: Jun. 25, 2008

(87) PCT Pub. No.: WO2007/023272
PCT Pub. Date: Mar. 1, 2007

(65) Prior Publication Data
US 2009/0115318 A1    May 7, 2009

(30) Foreign Application Priority Data

Aug. 23, 2005  (GB) .................... 0517195.4
Mar. 15, 2006  (GB) .................... 0605128.8

(51) Int. Cl.
*H05B 33/02* (2006.01)
(52) U.S. Cl.
USPC ............................................ 313/504; 445/24
(58) Field of Classification Search .............. 445/24; 313/504
See application file for complete search history.

(56) References Cited

U.S. PATENT DOCUMENTS

| 4,539,507 | A  |   | 9/1985  | VanSlyke et al. |
| 5,962,970 | A  | * | 10/1999 | Yokoi et al. .................... 313/506 |
| 6,037,712 | A  | * | 3/2000  | Codama et al. ............... 313/498 |
| 6,069,443 | A  | * | 5/2000  | Jones et al. .................... 313/504 |
| 6,878,312 | B1 | * | 4/2005  | Kanbe et al. ................... 252/583 |
| 7,307,381 | B2 |   | 12/2007 | Ito et al. ........................ 313/506 |

(Continued)

FOREIGN PATENT DOCUMENTS

| EP | 0 732 868 | 11/1998 |
| EP | 0 880 303 | 11/1998 |

(Continued)

OTHER PUBLICATIONS

Baldo et al., "Very High-Efficiency Green Organic Light-Emitting Devices Based on Electroohosphorescence," *Appl. Phys. Lett.*, 75(1):4-6 (1999).

(Continued)

*Primary Examiner* — Bumsuk Won
*Assistant Examiner* — Andrew Coughlin
(74) *Attorney, Agent, or Firm* — Marshall, Gerstein & Borun LLP

(57) ABSTRACT

An organic electronic device structure, the structure comprising: a substrate; a base layer supported by said substrate and defining the base of a well for solvent-based deposition of organic electronic material; one or more spacer layers formed over said base layer; a bank layer formed over said spacer layer to define a side of said well; and wherein an edge of said well adjacent said base layer is undercut to define a shelf over said base layer, said shelf defining a recess to receive said organic electronic material.

12 Claims, 11 Drawing Sheets

U.S. PATENT DOCUMENTS

| | | | |
|---|---|---|---|
| 7,365,484 B1 | 4/2008 | Sakai | |
| 2004/0169468 A1* | 9/2004 | Peng | 313/512 |
| 2004/0201048 A1* | 10/2004 | Seki et al. | 257/294 |
| 2005/0052120 A1* | 3/2005 | Gupta et al. | 313/503 |
| 2005/0112341 A1 | 5/2005 | Ito et al. | |
| 2005/0142974 A1* | 6/2005 | Lee | 445/24 |
| 2006/0035469 A1* | 2/2006 | Truong et al. | 438/739 |
| 2008/0030119 A1 | 2/2008 | Ito et al. | |

FOREIGN PATENT DOCUMENTS

| | | |
|---|---|---|
| EP | 0 989 778 | 3/2000 |
| EP | 0 993 235 | 4/2000 |
| JP | 11-212493 A | 8/1999 |
| JP | 2004071432 | 3/2004 |
| JP | 2005044577 | 2/2005 |
| JP | 2005-158494 A | 6/2005 |
| JP | 2005-174906 A | 6/2005 |
| JP | 2006-179213 A | 7/2006 |
| WO | WO-90/13148 | 11/1990 |
| WO | WO-95/06400 | 3/1995 |
| WO | WO-99/21935 | 5/1999 |
| WO | WO-99/48160 | 9/1999 |
| WO | WO-00/59267 | 10/2000 |
| WO | WO-01/16251 | 3/2001 |
| WO | WO-01/41229 | 6/2001 |
| WO | WO-02/18513 | 3/2002 |
| WO | WO-02/067343 | 8/2002 |
| WO | WO-03/083960 | 10/2003 |
| WO | WO-2004/049466 | 6/2004 |
| WO | WO-2005/076386 | 8/2005 |

OTHER PUBLICATIONS

Duineveld et al., "Ink-Jet Printing of Polymer Light-Emitting Devices," *Organic Light-Emitting Materials and Devices, Proceedings of SPIE*, 4464:59-67 (2002).

Hebner et al., "Ink-Jet Printing of Doped Polymers for Organic Light Emitting Devices," *Appl. Phys. Lett.*, 72(5):519-521 (1998).

Yang, "Review of Recent Progress on Poly e Electroluminescent Devices," *SPIE Photonics West: Optoelectronics*, Conf. 3279 (1998).

International Preliminary Report on Patentability for International Application No. PCT/GB2006/003135, dated Feb. 26, 2008.

International Search Report for International Application No. PCT/GB2006/003135, dated Jan. 29, 2007.

Written Opinion for International Application No. PCT/GB2006/003135, dated Jan. 29, 2007.

Combined Search and Examination Report for GB 0517195.4, dated Dec. 15, 2005.

* cited by examiner

ORGANIC ELECTRONIC DEVICE STRUCTURES AND FABRICATION METHODS

This invention relates to structures and fabrication methods for organic electronic devices, in particular organic light emitting diodes (OLEDs).

To assist in understanding the invention it is helpful to first describe some features of OLED displays and some problems with their fabrication. However it will be appreciated that although embodiments of the invention will be described with specific reference to OLED displays the techniques are more generally applicable to the fabrication of organic electronic devices.

Organic light emitting diodes (OLEDs) are a particularly advantageous form of electro-optic display. They are bright, colourful, fast-switching, provide a wide viewing angle and are easy and cheap to fabricate on a variety of substrates. Organic (which here includes organometallic) LEDs may be fabricated using either polymers or small molecules in a range of colours (or in multi-coloured displays), depending upon the materials used. A typical OLED device comprises two layers of organic material, one of which is a layer of light emitting material such as a light emitting polymer (LEP), oligomer or a light emitting low molecular weight material, and the other of which is a layer of a hole transporting material such as a polythiophene derivative or a polyaniline derivative.

Organic LEDs may be deposited on a substrate in a matrix of pixels to form a single or multi-colour pixilated display. A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

FIG. 1 shows a vertical cross section through an example of an OLED device 100. In an active matrix display part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired, and so that it does not obscure the display, by a conventional process of photolithography followed by etching.

A substantially transparent hole transport layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapour deposition. A cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. Mutual electrical isolation of cathode lines may achieved through the use of cathode separators (element 302 of FIG. 3b). Typically a number of displays are fabricated on a single substrate and at the end of the fabrication process the substrate is scribed, and the displays separated before an encapsulating can is attached to each to inhibit oxidation and moisture ingress.

Organic LEDs of this general type may be fabricated using a range of materials including polymers, dendrimers, and so-called small molecules, to emit over a range of wavelengths at varying drive voltages and efficiencies. Examples of polymer-based OLED materials are described in WO90/13148, WO95/06400 and WO99/48160; examples of dendrimer-based materials are described in WO 99/21935 and WO 02/067343; and examples of small molecule OLED materials are described in U.S. Pat. No. 4,539,507. The aforementioned polymers, dendrimers and small molecules emit light by radiative decay of singlet excitons (fluorescence). However, up to 75% of excitons are triplet excitons which normally undergo non-radiative decay. Electroluminescence by radiative decay of triplet excitons (phosphorescence) is disclosed in, for example, "Very high-efficiency green organic light-emitting devices based on electrophosphorescence" M. A. Baldo, S. Lamansky, P. E. Burrows, M. E. Thompson, and S. R. Forrest *Applied Physics Letters*, Vol. 75(1) pp. 4-6, Jul. 5, 1999. In the case of a polymer-based OLED layers 108 comprise a hole transport layer 108a and a light emitting polymer (LEP) electroluminescent layer 108b. The electroluminescent layer may comprise, for example, around 70 nm (dry) thickness of PPV (poly(p-phenylenevinylene)) and the hole transport layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

FIG. 2 shows a view from above (that is, not through the substrate) of a portion of a three-colour active matrix pixilated OLED display 200 after deposition of one of the active colour layers. The figure shows an array of banks 112 and wells 114 defining pixels of the display.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, the substrate is provided with a plurality of cathode undercut separators 302 to separate adjacent cathode lines (which will be deposited in regions 304). A plurality of wells 308 is defined by banks 310, constructed around the perimeter of each well 308 and leaving an anode layer 306 exposed at the base of the well. The edges or faces of the banks are tapered onto the surface of the substrate as shown, typically at an angle of between 10 and 40 degrees. The banks present a hydrophobic surface in order that they are not wetted by the solution of deposited organic material and thus assist in containing the deposited material within a well (although polar or non-polar solvents may be employed generally the solvents used have some polarity). This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960.

As previously mentioned, the bank and separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 µm in height and approximately 20 µm wide. Banks are generally between 20 µm and 100 µm in width and in the example shown have a 4 µm taper at each edge (so that the banks are around 1 µm in height). The pixels of FIG. 3a are approximately 300 µm square but, as described later, the size of a pixel can vary considerably, depending upon the intended application.

Techniques for the deposition of material for organic light emitting diodes (OLEDs) using ink jet printing techniques are described in a number of documents including, for example, T. R. Hebner, C. C. Wu, D. Marcy, M. H. Lu and J. C. Sturm, "Ink-jet Printing of doped Polymers for Organic Light Emitting Devices", *Applied Physics Letters*, Vol. 72, No. 5, pp. 519-521, 1998; Y. Yang, "Review of Recent Progress on Polymer Electroluminescent Devices," *SPIE Photonics West: Optoelectronics '98*, Conf. 3279, San Jose, January, 1998; EP 0 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

A volatile solvent is generally employed to deposit a organic electronic material, with 0.5% to 4% dissolved solvent material. This can take anything between a few seconds and a few minutes to dry and results in a relatively thin film in comparison with the initial "ink" volume. Often multiple drops are deposited, preferably before drying begins, to provide sufficient thickness of dry material. Solvents which may be used include cyclohexylbenzene and alkylated benzenes, in particular toluene or xylene; others are described in WO 00/59267, WO 01/16251 and WO 02/18513; a solvent comprising a blend of these may also be employed. Precision ink jet printers such as machines from Litrex Corporation of California, USA are used; suitable print heads are available from Xaar of Cambridge, UK and Spectra, Inc. of NH, USA. Some particularly advantageous print strategies are described in the applicant's UK patent application number 0227778.8 filed on 28 Nov. 2002 (and the corresponding PCT publication WO 2004/049466).

Inkjet printing has many advantages for the deposition of materials for organic electronic devices but there are also some drawbacks associated with the technique. However it has been found that dissolved organic electronic material deposited into a well with shallow edges dries to form a film with a relatively thin edge. FIGS. 4a and 4b illustrate this process.

FIG. 4a shows a simplified cross section 400 through a well 308 filled with dissolved material 402, and FIG. 4b shows the same well after the material has dried to form a solid film 404. In this example the bank angle is approximately 15° and the bank height is approximately 1.5 µm. As can be seen a well is generally filled until it is brimming over. The solution 402 has a contact angle $\theta_c$ with the plasma treated bank material of typically between 30° and 40° for example around 35°; this is the angle the surface of the dissolved material 402 makes with the (bank) material it contacts, for example angle 402a in FIG. 4a. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate. The result, shown in FIG. 4b, is that the film of dry material 404 can be very thin, for example of the order of 10 nm or less, in a region 404a where it meets the face of a bank. We have previously described, in UK Patent Application No. 0402559.9, filed 5 Feb. 2004, published as WO 2005/076386, the use of undercut banks which the have the effect of pulling the solution towards the edge of a well, thus helping to obtain a more uniform fill. However such banks can be tricky to fabricate and generally use negative photoresist which is expensive and sensitive to process conditions. There is therefore a need for further improved techniques which are more suitable for use with positive photoresists.

Another difficulty arises with larger pixels (wells), for example wells with an opening of 240 µm to 260 µm used to provide a 300 µm pixel pitch. The volume of an ink drop is proportional to the cube of a characteristic length for the drop whereas surface coverage is proportional to the square of a pixel dimension and because of this for a given ink dilution too much material is deposited into a large pixel so that more dilute ink is needed. For example for large pixels and a desired PED(O)T film thickness of 80 nm an ink concentration of approximately one percent may be employed, but it is difficult to get one percent ink to spread out, wet and fill a large pixel. This makes the fabrication of pixels more than 500 µm square difficult because, say, a full-to-brimming pixel results in a 120 nm thickness film. Moreover it is expensive to alter the ink dilution in a production process.

Generally the base of a pixel well comprises ITO, which has a low contact angle, typically less than 10 degrees (for example five to seven degrees) and thus provides relatively good (hydrophilic) wetting. However, particularly with larger pixels, wetting is never perfect and rather than a deposited droplet having a circular shape, a deposited droplet generally has a more ragged edge because the solvent tends to be pinned at points within the well base. As previously mentioned, because the contact angle of the solvent on the bank is relatively high as more solvent is added to a well the droplet height tends to increase rather than the solvent moving up the bank and, on drying, surface energy tends to pull the solution away from the edge of the well. This is particularly a problem with PEDOT deposition where the thin edge can result in direct contact between the cathode (ITO) and overlying light emitting polymer (LEP) resulting in a defective or reduced efficiency pixel. In EP 0993235 Seiko Epson have aimed to address this problem by depositing a dielectric layer over the anode at the inside edge of the base of a pixel well, but this has the drawback of reducing the effective pixel area by up to 20 percent when the need for alignment tolerance is taken into account.

There is therefore a need for improved organic electronic device structures and fabrication techniques which address these problems and, in particular, help to spread out organic electronic material in a solvent-based deposition process.

According to a first aspect of the present invention there is therefore provided a organic electronic device structure, the structure comprising: a substrate; a base layer supported by said substrate and defining the base of a well for solvent-based deposition of organic electronic material; one or more spacer layers formed over said substrate; a bank layer formed over said spacer layer to define a side of said well; and wherein an edge of said well adjacent said base layer is undercut to define a shelf over said substrate, said shelf defining a recess to receive said organic electronic material.

Preferably the underside of the shelf is substantially horizontal and spaced away from the substrate by a distance defined by the one or more spacer layers. The shelf may be defined by the bank or one or more shelf layers maybe included in the structure between the spacer layer and the bank layer, to define the shelf. Preferably the shelf layer comprises the dielectric layer but, in embodiments, the shelf layer may include a metal layer. It will be appreciated from the embodiments described later that the shelf and/or spacer layers are generally provided by layers which are already present for fabrication of the device such as metal, oxide and/or doped or undoped silicon layers. For an active matrix display device a thin film transistor (TFT) is associated with each pixel and then the spacer layer may be formed by part of a doped and/or undoped amorphous silicon layer used for fabrication of the TFT, or an oxide layer. Likewise the shelf layer may also conveniently be formed by one of the layers which are in any case deposited during fabrication of the TFT such as a silicon nitride dielectric and/or passivation layer.

Preferably the recess under the shelf is configured to permit contact between the spacer layer and the organic electronic material—that is the recess exposes an edge of the spacer layer. This assists in pinning the solvent to the edge of the well. Thus in preferred embodiments (where the solvent is at least partially polar) the spacer layer comprises a hydrophilic material such as silicon, silicon monoxide, silicon dioxide, silicon oxynitride or the like. Optionally the spacer layer may be treated to make it (more) hydrophilic.

In embodiments using a hydrophilic material for the spacer layer helps to de-couple desired attributes for PEDOT and LEP wetting since the PEDOT wets the hydrophilic spacer layer thus allowing the wetting angle of the LEP on the bank to be adjusted substantially independently (since PEDOT wetting is dominated by the hydrophilic material). For example generally the bank resist is hydrophobic with a wetting angle of greater then 90 degrees for the LEP solvent, but this may be reduced to less than 90 degrees, 60 degrees or even 30 degrees, for example to provide improved wetting of the LEP to the bank material. Because the PEDOT solvent runs under the shelf and is pinned by the hydrophilic layer the risk of shorting across the PEDOT layer is drastically reduced. It will be appreciated that although reference has generally been made to the spacer layer providing a hydrophilic edge for the PEDOT solvent pinning (because solvents with some polarity tend to be employed), more generally good wetting of the solvent to the exposed spacer layer edge is desirable as defined, for example, by a low contact angle such as 15 degrees, 10 degrees or less.

It will be appreciated that with embodiments of the above structure the bank layer can taper towards the substrate in the usual direction (getting thinner towards the substrate as the well side is approached), and therefore a bank may be defined using positive photoresist.

In some preferred embodiments the structure forms part of an OLED display device such as an active matrix display pixel. In this case the base layer generally comprises a transparent anode layer such as ITO and the organic electronic material which is deposited into the well comprises a first layer of conducting (whole) transport material such as PEDOT overlying which is a second layer of light emitting material, for example light emitting polymer, small molecule material, dendrimer-based material or the like. The recess under the shelf is then occupied by the first layer of organic electronic material (for example the PEDOT), preferably substantially fully occupied by this material, and the second light-emitting layer overlies the first layer and may also ride partially up the bank. In other embodiments the light-emitting layer may also lie under the shelf and be pinned at the well edge by a second spacer layer which may, for example, be tuned according to the solvent used to deposit the light-emitting layer to provide good wetting. In one such embodiment the first spacer layer comprises undoped (amorphous) silicon and the second spacer layer doped (amorphous) silicon, both used in the fabrication of an active matrix TFT transistor and hence convenient to deposit for pinning at the well edge.

In a related aspect the invention provides a method of fabricating a organic electronic device on a substrate, the method comprising: fabricating one or more base layers on said substrate; fabricating one or more spacer layers on said one or more base layers; depositing bank material over said one or more spacer layers; etching said substrate to define a well with an undercut shelf defining a recess at its base; and depositing organic electronic material into said well.

Preferably the etching comprises at least partially self-aligned etching. In this way a mask used to define the bank may also be used for etching the undercut shelf to expose the spacer layer for, in a partially self-aligned device, for etching the shelf layer.

In a further aspect the invention provides a method of forming a droplet deposition well in a structure for droplet-deposition-based fabrication of a organic electronic device, the method comprising: depositing onto a substrate, a layer of hydrophilic material; depositing a layer of bank material over said layer of hydrophilic material; patterning said layer of bank material to define banks forming one or more of said droplet position wells; and etching said layer of hydrophilic material in a self-aligned process using said patterned layer of bank material as a resist.

In embodiments this method avoids the need for two separate mask steps, one for the bank material and a second for the hydrophilic (or spacer) layer. The skilled person will understand that in general the substrate to which the method is applied will have been purchased or prepared with an initial, underlying layer of transparent conductor, such as ITO. In some preferred embodiments of the method the bank material comprises resist, preferably positive resist. Preferably a bank has only one layer of bank material (which is preferably hydrophobic), and only one layer of hydrophilic material (such as oxide).

In some preferred embodiments of the method the hydrophilic material comprises dielectric material, in particular $SiO_2$, although other dielectric materials such as silicon nitride and silicon oxynitride or even resist may also be employed. In other embodiments the hydrophilic material comprises a hydrophilic metal such as aluminium, chrome or molychrome. In such embodiments the metal may be, for example, anode metal formed over the ITO to reduce the anode track resistance. In embodiments of an OLED device fabricated using this method the metal can be exposed to organic electronic material, in particular PEDOT, which is afterwards deposited in the well. However where the metal is a poor electron injector (has a high work function) for the relevant material (PEDOT), this contact does not significantly the operation of the device because, in effect, it behaves substantially as an insulator.

The self-aligned etch stage, in which the bank resist acts as a mask, may be either isotropic or anisotropic. In preferred embodiments the etching comprises plasma etching. An isotropic etch undercuts the hydrophilic layer (which thus acts as a spacer between the substrate and the overlying bank layer); an anisotropic etch cuts substantially vertically down through the edge of the hydrophilic later where the bank edge (which is generally tapered) terminates. In the case of an isotropic etch a dry etch, in particular a plasma gas etch may be employed, which is self-limiting within the undercut, allowing the depth of the undercut to be controlled. Alternatively a wet etch may be employed, which continues to etch so long as the etchant is present. For an anisotropic etch a dry plasma etch is preferred.

For an undercut embodiment of the device structure the hydrophilic (spacer) layer may have a thickness of less than 500 nm, for example between 50 nm and 200 nm, and some in embodiments around 100 nm. In other embodiments, where the hydrophilic layer provides (effective) insulation to help reduce shorting at the base of the bank edge (where the deposited organic electronic material tend to be thinner because of solvent drying effects), the hydrophilic layer may be thinner, for example less than 100 nm, 50 nm, 10 nm or 5 nm. The limiting thickness is determined by the desire to form a continuous insulating film, and may be around 2 nm for $SiO_2$. An anisotropic etch is preferred for embodiments of the method which create an insulating shelf at the base of a well, as this substantially prevents undercutting, thus reducing the quantity of bank material to be removed to leave such a shelf.

In some particularly preferred embodiments a resist stripping procedure, preferably a plasma ashing procedure such as an $O_2$ plasma ash is performed after the etching. This removes part of the base of the (tapered) bank where it is thinnest (and also reduces the overall thickness of the bank), that is adjacent the base of the well, to expose the hydrophilic material adjacent the base of the well. This enlarges the aperture of the bank material so that it is greater than that in the hydrophilic layer. The exposed part of the hydrophilic layer acts as an insulating spacer, as previously mentioned, to help to prevent shorts at the edge of a well base. In particular it attracts the hydrophilic PEDOT solution, which effectively attaches to the exposed part of this material, pinning the edge of a droplet of such deposited material. Moreover, because the PEDOT solution is confined in this way, the surface energy properties of the layer of bank material can be separately tuned towards a desired character for a subsequently deposited layer of material, such as a layer of light emitting polymer (LEP). In the case of bank resist, for example, this may be done by treating the bank material with a $CF_4$ plasma to make it hydrophobic, for better LEP confinement. (This "tuning" has little effect on the hydrophilic property of the underlying oxide, although there is a small "contamination effect"). Alternatively a "teflonised" or fluorinated resist may be employed to achieve a hydrophobic bank character. Thus these embodiments of the method broadly speaking allow the different desired surface energy treatments (hydrophilic and hydrophobic) for solution deposition of, say PEDOT and LEP, to be decoupled. Moreover, the high bank contact angle of, say a solution of PEDOT in water, which may be 90°-110°, helps keep the PEDOT off the bank and therefore contain this material.

Thus in a further aspect the invention provides a method of forming a droplet deposition well in a structure for droplet-deposition-based fabrication of a organic electronic device, the method comprising: depositing onto a substrate, a layer of hydrophilic material; depositing a layer of resist material over said layer of hydrophilic material; patterning said layer of resist material to define banks forming one or more of said droplet deposition wells; patterning said layer of hydrophilic material to remove said hydrophilic material from at least part of a base area of said one or more droplet deposition wells; and using a resist stripping procedure to expose part of an upper surface of said patterned layer of hydrophilic material adjacent a base of a said bank forming one or more of said droplet deposition wells.

In embodiments providing a lower layer which juts out beyond the bank, and which has a similar surface energy to underlying ITO, can help yield and uniformity without a significant effect on cost and aperture ratio. The structure which is subjected to the resist stripping (ashing) need not have been formed by a self-aligned process but could, for example, have been formed using a two-mask process.

In a related aspect the invention provides a organic electronic device fabricated using a method as described above. In particular such a device comprises a substrate bearing a patterned layer of hydrophilic material beneath a plurality of droplet deposition wells filled with organic electronic material, wherein part of an upper surface of said patterned layer of hydrophilic material adjacent a base of a said bank forming one or more of said droplet deposition wells is exposed to said organic electronic material.

In a still further aspect the invention provides a organic electronic device structure, the structure comprising: a substrate; and a bank layer supported by said substrate and defining a well for solvent-based deposition of organic electronic material; and wherein said structure further comprises a fillet layer patterned to define a fillet at an inside edge of said well and at the base of said well.

Preferably the fillet comprises hydrophilic material such as an oxide and/or nitride of silicon. The fillet layer may conveniently comprise a layer which also forms some other part of the organic electronic device such as an oxide layer of a thin film transistor forming part of or associated with the device.

In one embodiment the fillet overlies a part of the bank which tapers down towards the substrate; in another set of embodiments one or more layers are patterned to define a step at the inside edge of the well and the fillet abuts the step. For example in preferred embodiments the well has a base layer, such as an anode or ITO layer and a step layer (which again may be provided by "re-using" an existing layer of the device) is provided between the base layer and the substrate to provide a step change in height in the base layer adjacent the inside edge of the well. In this case the fillet abuts this step in the base layer. In some embodiments a double step is defined in the base layer using two (or more) underlying "step" layers to provide a taller spacer stack under the ITO and thus a larger fillet area for improved solvent pinning at the edge of the well. In embodiments the one or more step layers may comprise one or more of a metal layer, an undoped silicon layer, a doped silicon layer, and a second metal layer. These layers may, for example, already be present as part of an existing fabrication process for a thin film transistor associated with a pixel of an OLED display device. Preferably in such a device the bank layer comprises positive photoresist and is conventionally tapered towards the substrate. The deposited layers of organic electronic material in this case may comprise a conductive (whole transport) layer and an overlying light-emitting layer.

In another aspect the invention provides a method of fabricating a organic electronic device on a substrate bearing at least one well for solvent-based deposition of organic electronic material, the method including depositing a fillet layer and anisotropically etching said fillet layer to define a fillet at an inside edge of said well prior to solvent-based deposition of said organic electronic material for fabricating said device.

Preferably the fillet material is selected or treated such that it is wetted by a solvent or solvent mix used to deposit the organic electronic material. Preferably such wetting provides a contact angle between the fillet and the solvent or solvent mix of less than 15 degrees, more preferably less than 10 degrees.

The invention further provides a organic electronic device, in particular an active or passive OLED display device fabricated according to a method of an aspect of the invention. These and other aspects of the invention will now be further described, by way of example only, with reference to the accompanying figures, in which.

Figure 1:
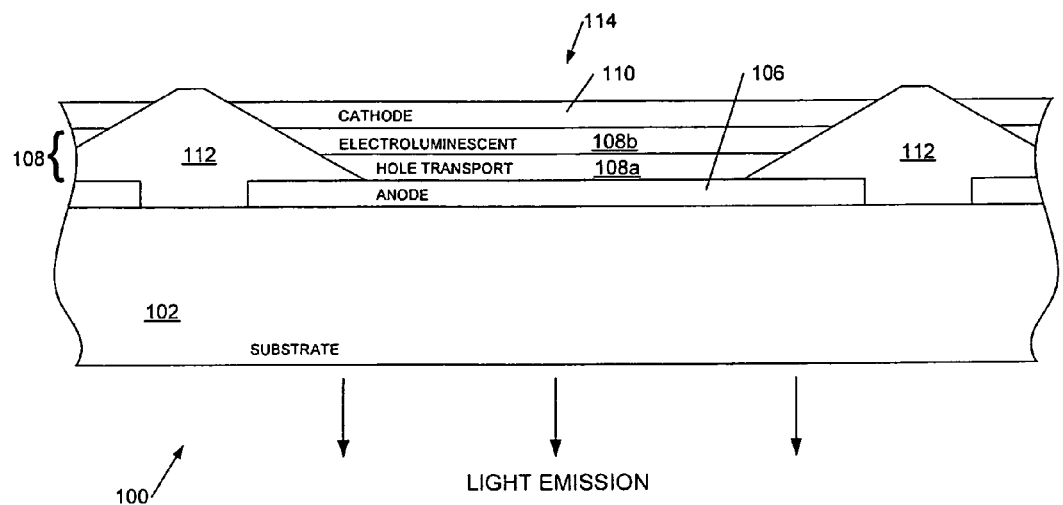
FIG. 1 shows a vertical cross section through an example of an OLED device.
Figure 2:
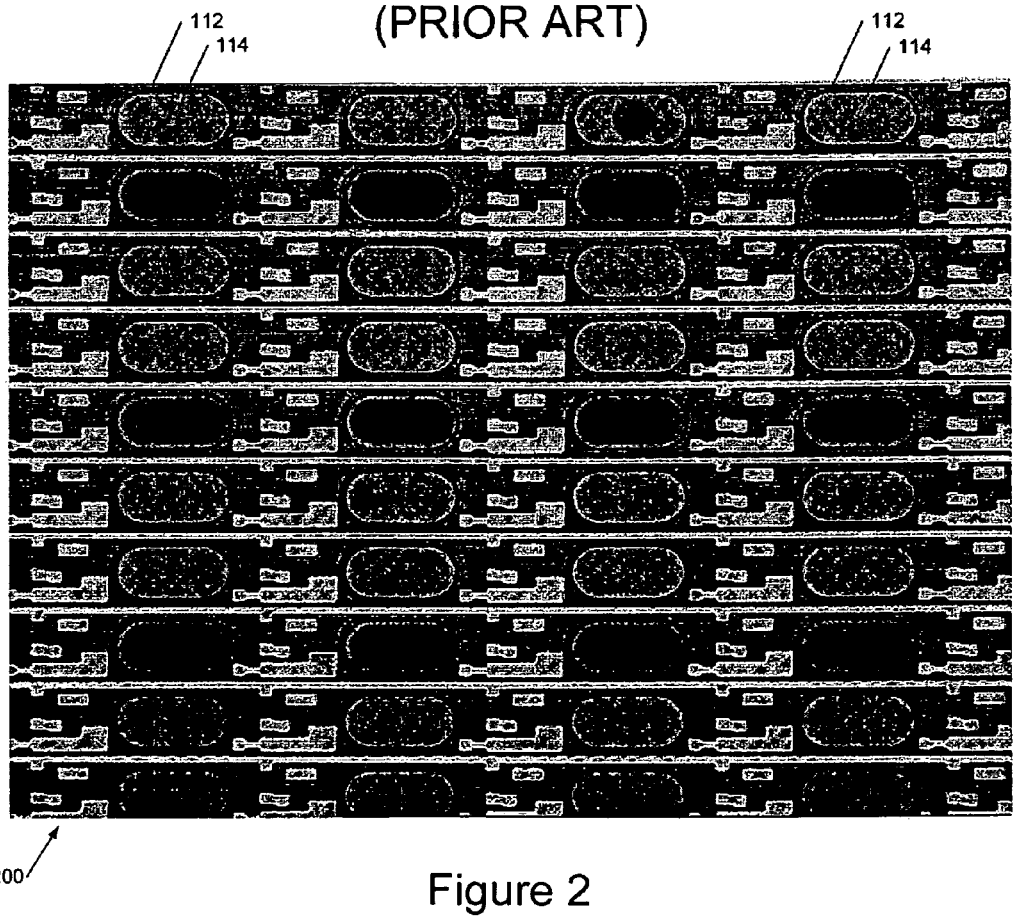
FIG. 2 shows a view from above of a portion of a three colour pixelated OLED display.
Figure 3A:
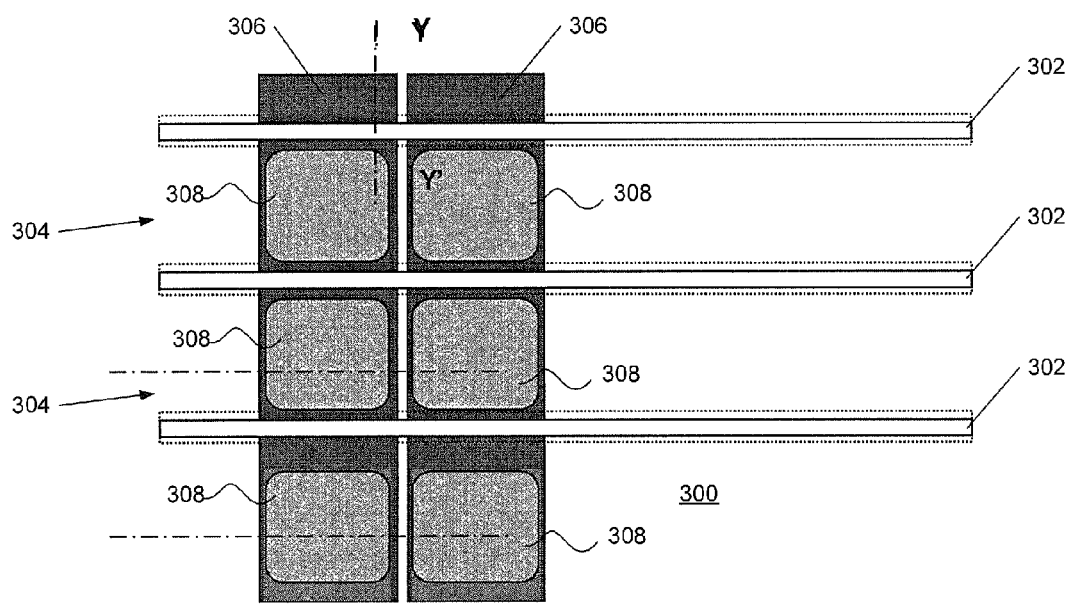
FIGS. 3a and 3b show a view from above and a cross-sectional view respectively of a passive matrix OLED display.
Figure 3B:
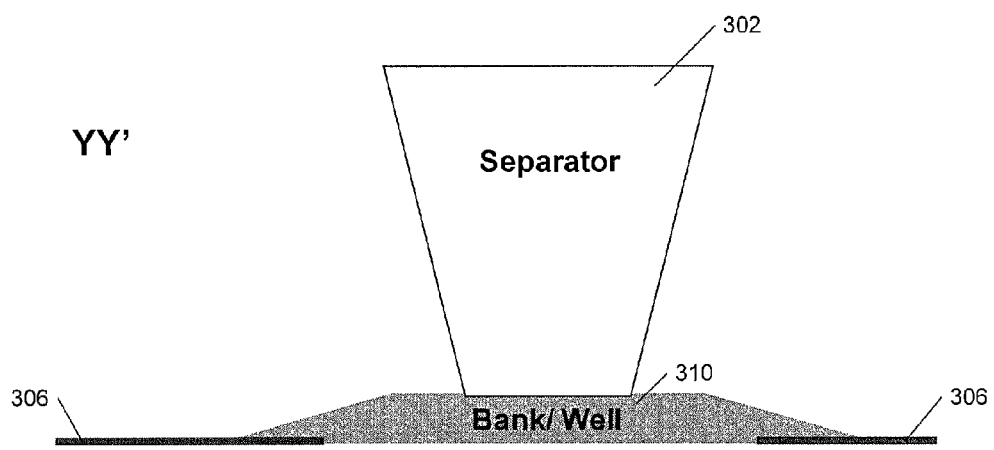
Figure 4A:
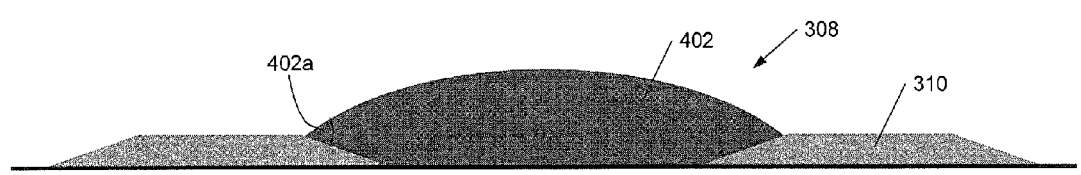
FIGS. 4a and 4b show a simplified cross section of a well of an OLED display substrate filled with, respectively, dissolved material, and dry material.
Figure 4B:
Figure 5:
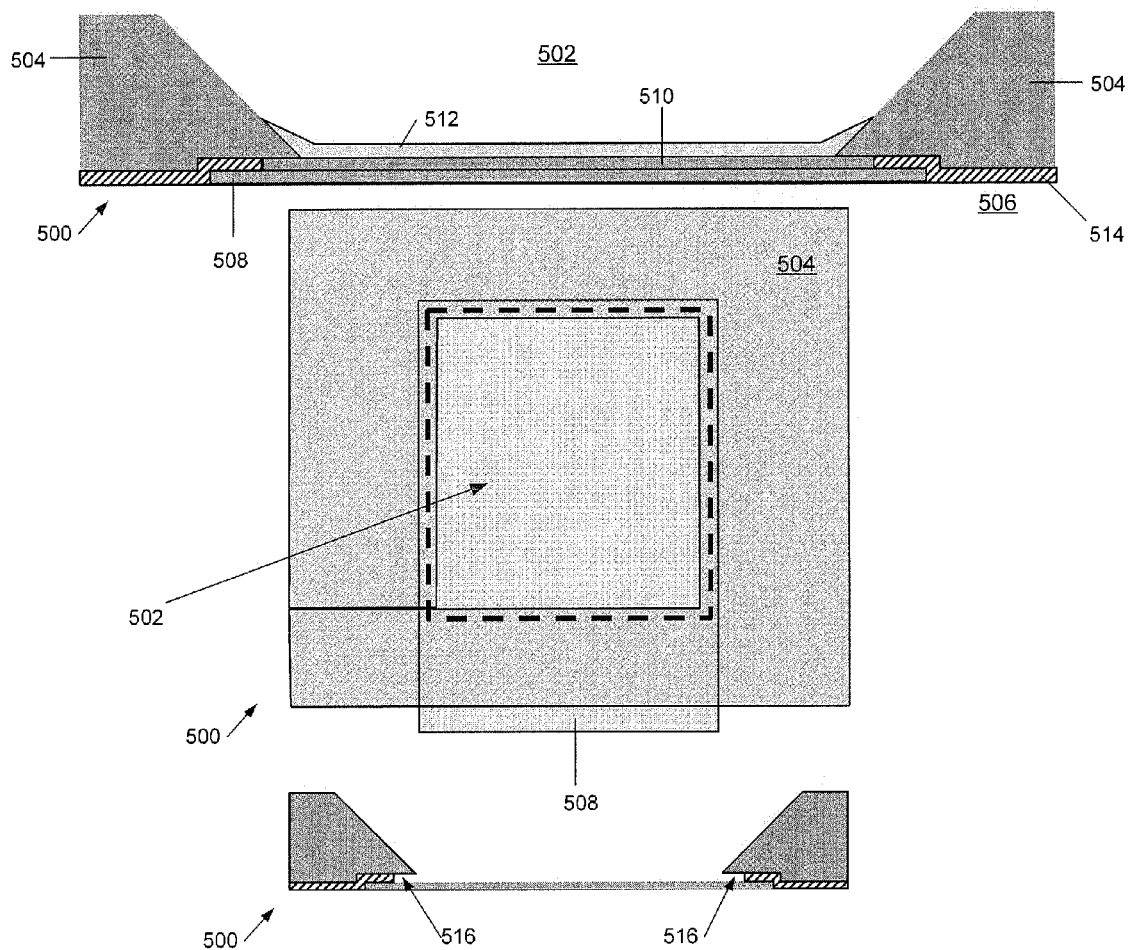
FIG. 5 shows a organic electronic device structure according to a first embodiment of a first aspect of the invention.

Referring first to FIG. 5, this shows a vertical cross-section through and view from above of a first structure 500 for a well 502 of a pixel of an active matrix OLED display. The well 502 is defined by banks 504 which taper towards a substrate 506 over which lies an ITO layer 508 providing an anode for the pixel. Within well 502 is deposited a layer 510 of PEDOT over which lies a layer 512 of light-emitting polymer (LEP). FIG. 5 also shows a cross-sectional view of the structures prior to deposition of PEDOT and LEP layers.

An oxide spacer layer 514 is provided over ITO layer 518 and beneath bank layer 504. This is etched, after patterning of the positive bank photoresist, using a conventional wet or dry isotropic etch process. This etch process results in an overhanging shelf 516 around the lower inside edge of the well 502 (shown by the dashed line in the view from above), providing a recess into which solvent bearing dissolved PEDOT can flow during the deposition process. The PEDOT solution will naturally wick into the recess by capillary action, but since the oxide spacer 514 is hydrophilic the solvent will also attach to the exposed inside edge of layer 514 under the shelf 516. The combination of these two effects in embodiments provides a reliable PEDOT edge thickness profile. The PEDOT remains attached to this recessed edge but not to the (hydrophobic) bank on drying. The bank can, for example, be treated by $CF_4$ to provide a surface tailored specifically to deposition of the LEP (that is hydrophobic to a desired degree) largely independent of the PEDOT solution requirements because the PEDOT solution is effectively pinned by the exposed edge of hydrophilic layer 514 and/or capillary attraction of the recess.

In a simple example fabrication process an ITO-coated substrate is bought in from any of a range of suppliers, patterned and then coated with blanket oxide such as silicon dioxide, silicon monoxide or silicon oxynitride, to provide a hydrophilic layer. This blanket oxide may comprise, for example, spin-on-glass. The positive photoresist layer 504 is then spun on and patterned (exposed, developed and rinsed) by photolithography. The recess is then formed by isotropic etch-back of the oxide spacer layer 514 without the need for an additional mask—the process is self-aligned because the bank effectively provides an etch mask for the oxide layer.

Figure 6:
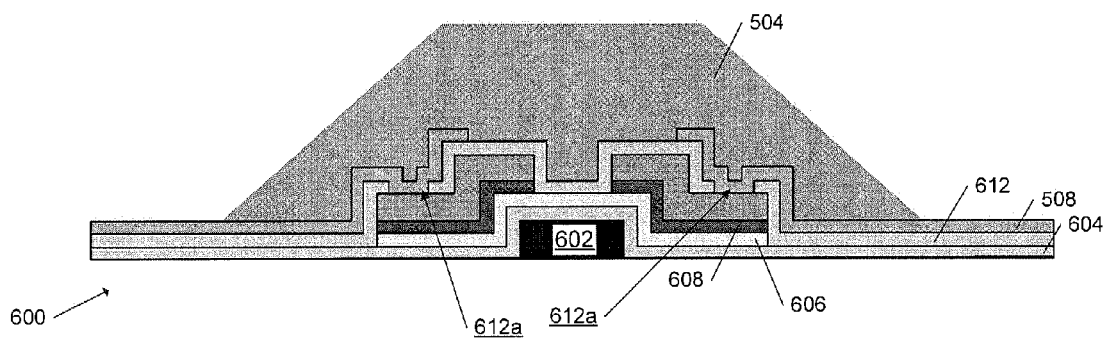
FIG. 6 shows a bottom-gate thin film transistor (TFT) structure suitable for fabrication alongside structures embodying aspects of the invention.

FIG. 6 shows a vertical cross-section through a bottom-gate TFT structure 600 which may be fabricated alongside the pixel structure 500 of FIG. 5 and/or alongside other embodiments of both the first and second aspects of the invention described further later. In FIG. 6 like elements to those of FIG. 5 are indicated by like reference numerals. In this example the substrate is not already patterned with ITO and, instead, a first, relatively thick metal layer 602 is deposited onto the glass substrate 506 and patterned to provide gate metal for the TFT. A gate dielectric layer 604, for example comprising silicon nitride is deposited over gate metal 602, followed by deposition and patterning of an undoped amorphous silicon layer 606 and a doped amorphous silicon layer 608 forming, respectively, channel and drain/source regions of the TFT. A second metal layer 610 is then deposited and patterned to provide source and drain conductors for the transistor and a passivation layer 612 again, for example, of silicon nitride is then deposited over the structure and source and drain contact windows 612a are etched. The ITO layer 508 is then deposited making connections to the source and drain electrodes to link these to one or more adjacent pixels. In a conventional process this ITO layer is the last layer before the bank photoresist layer 504 is deposited but when this TFT structure is used in conjunction with, for example, the improved well structure of FIG. 5 a further oxide layer (not shown in FIG. 6) is deposited over the ITO layer prior to deposition and patterning of the bank layer 504.

Figure 7:
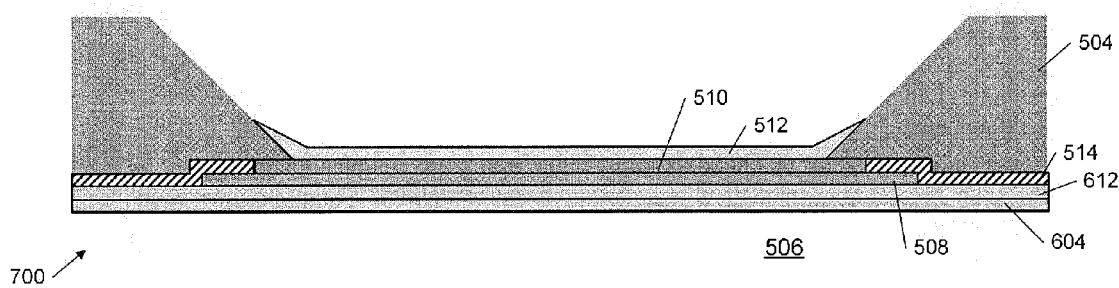
FIG. 7 shows a organic electronic device structure according to a second embodiment of a first aspect of the invention.

Referring now to FIG. 7, this shows a more typical "real life" well structure employing the principle illustrated in FIG. 5.

In FIG. 7, and the following figures, like elements to those of FIGS. 5 and 6 are indicated by like reference numerals.

In the embodiment of the well structure 700 illustrated in FIG. 7 two underlying silicon nitride layers (dielectric layer 604 and passivation layer 612) are illustrated.

Figure 8:
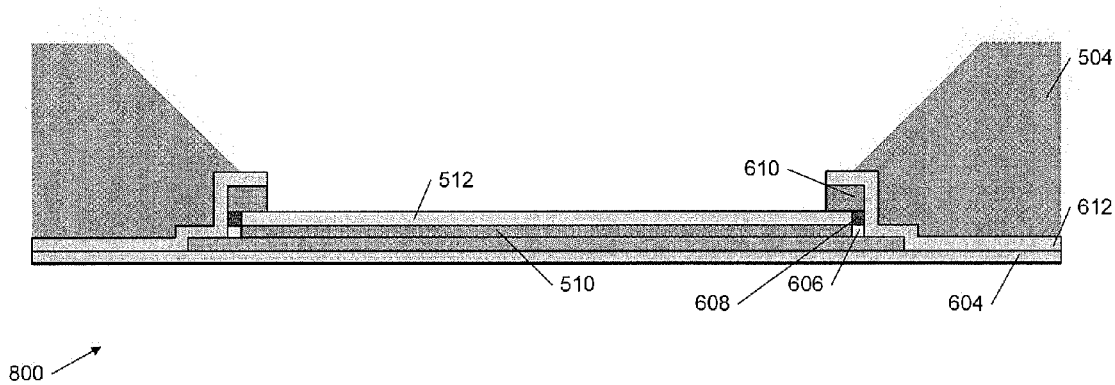
FIG. 8 shows a organic electronic device structure according to a third embodiment of a first aspect of the invention.

FIG. 8 illustrates a further embodiment of a well structure 800 in which a shelf is provided by a combination of the passivation layer 612 and the second metal layer 610. Unlike the previous two embodiments, this embodiment is only partially self-aligned and, moreover, it involves deposition of an ITO layer 508 prior to any of the silicon layers. This is possible in an active matrix display because the TFT structure is only used in active areas of a pixel. However although the layer sequence is different in this embodiment the same general principle is employed.

In outline, the silicon 606, 608, metal 610 and nitride 612 layers are aligned within the bank edge and then isotropic etch-back of the silicon layers under the metal edge is employed to create the structure (since the metal is not attacked by the silicon edge). The metal and/or nitride layers are patterned at the same time.

In the well structure 800 the space under the shelf is potentially deeper than that of the previous embodiments and in embodiments (as shown) this depth may not be completely filled by the PEDOT layer. In such cases the electroluminescent layer also extends under the shelf. The PEDOT layer and electroluminescent light-emitting layer may each be associated with a different respective spacer layer, for example undoped and doped silicon (both hydrophilic) as shown. The thickness of a layer of organic material may be up to 500 nm although the thickness will generally be less, for example in the range 50 nm to 200 nm; in the embodiment of FIG. 8 the total height of the recess under the shelf may be up to 500 nm (or more).

Figure 9:
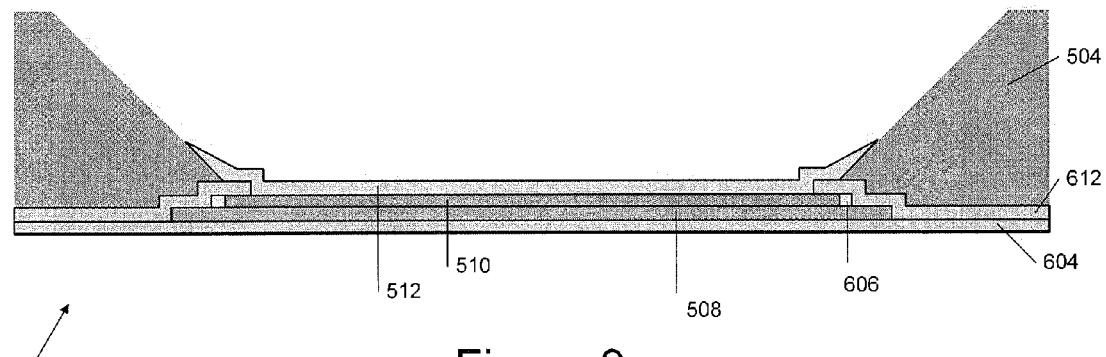
FIG. 9 shows a organic electronic device structure according to a fourth embodiment of the first aspect of the invention.

Referring next to FIG. 9 this shows a further embodiment of a well structure 900, again using a partially self-aligned etch process with ITO deposition before silicon deposition. In outline, silicon and nitride layers are aligned with the bank edge and then the silicon layer is isotropically etched back under the nitride edge. This is possible in a structure incorporating a TFT because the doped and undoped silicon layers are etched at different stages.

Figure 10:
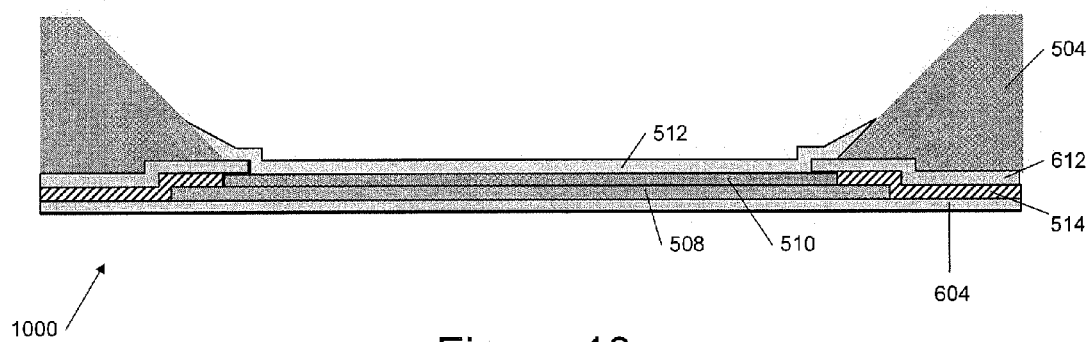
FIG. 10 shows a organic electronic device structure according to a fifth embodiment of the first aspect of the present invention.

FIG. 10 shows a still further embodiment of a well structure 1000, in which oxide spacer layer 514 is deposited after ITO layer 508 but before the (silicon nitride) passivation layer 612. Fabrication of the structure is partially self-aligned as the recess is formed by isotropic etch-back of the oxide layer. Again the PEDOT solution wicks into the recess and is pinned at the edge of the well by hydrophilic and/or capillary action to help provide a reliable PEDOT edge thickness profile.

Figure 11:
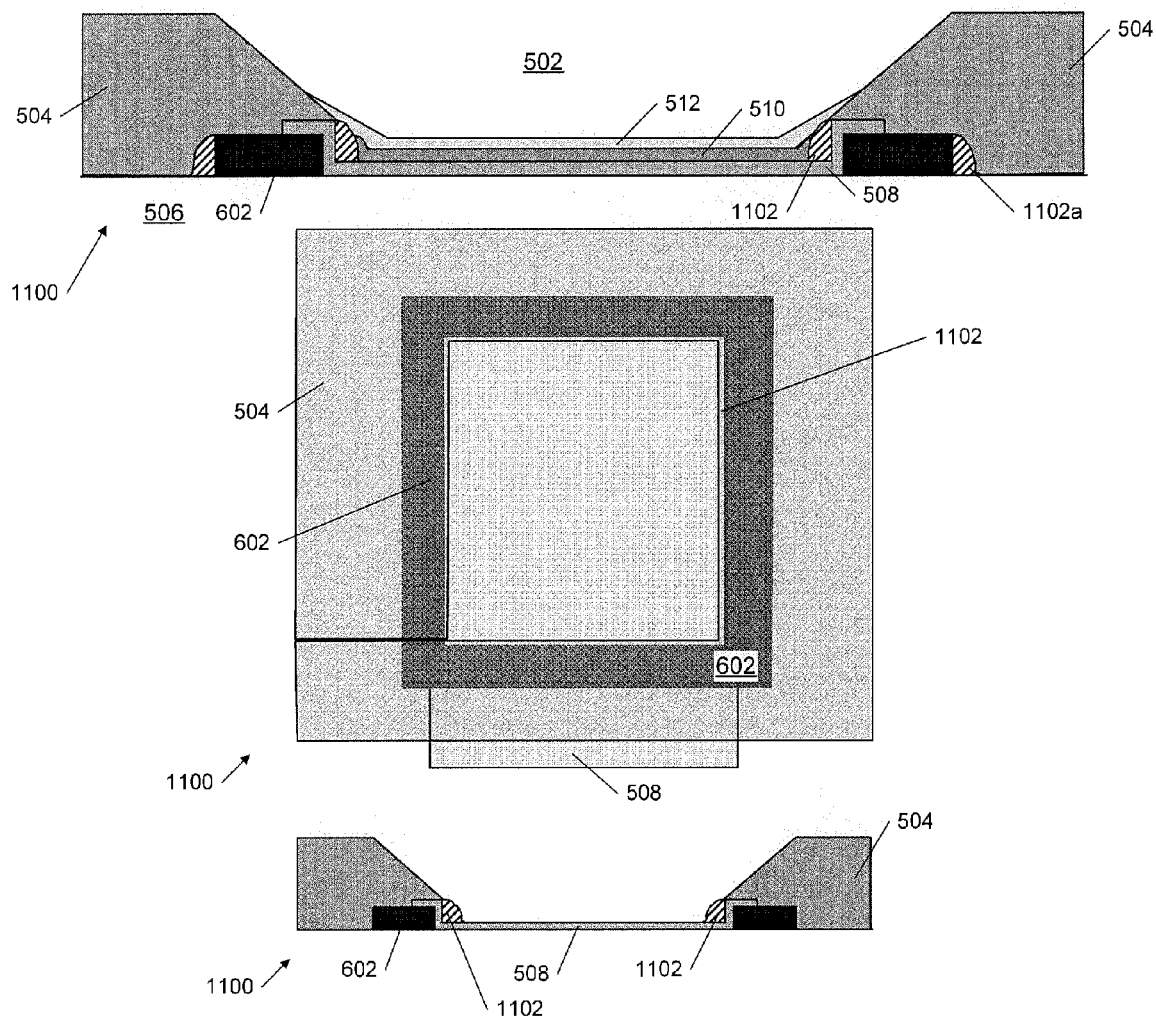
FIG. 11 shows a organic electronic device structure according to a first embodiment of a second aspect of the invention.

Referring now to FIG. 11, this shows a vertical cross-section (before and after solvent-based organic material deposition) and a view from above of a first embodiment of a well structure 1100 in accordance with a second aspect of the invention.

Again, in this embodiment and those that follow, like layers to those described above are indicated by like reference numerals.

In FIG. 11 the first metal layer 602 is patterned to provide a "picture frame" around the perimeter of the well just outside its inner edge. This creates a step in the overlying ITO 508. A blanket oxide layer is then deposited and an isotropically (vertically) etched in a manner well known to those skilled in the art to create fillets 1102, 1102a of material on the vertical edges. These oxide fillets comprise hydrophilic material and thus help to pin the PEDOT-containing solvent to the edge of the well (but this solvent tends not to run up the hydrophobic bank edge). The hydrophobic $CF_4$ surface treatment can thus be adapted according to the LEP solvent largely independently of the PEDOT deposition because the PEDOT solvent runs only a short distance up the bank, if at all. The bank material, treatment and/or LEP solvent can therefore be adjusted therefore, for example so that the LEP solvent wets the bank to some degree, leaving a tail of LEP running up the bank as shown. It will be appreciated that although FIG. 11 shows exact alignment of the bank edge with the fillet, in practice this may not occur but it will be appreciated that the structure provides some tolerance to small variations in bank edge alignment (which can arise particularly with a tapered bank edge).

Figure 12:
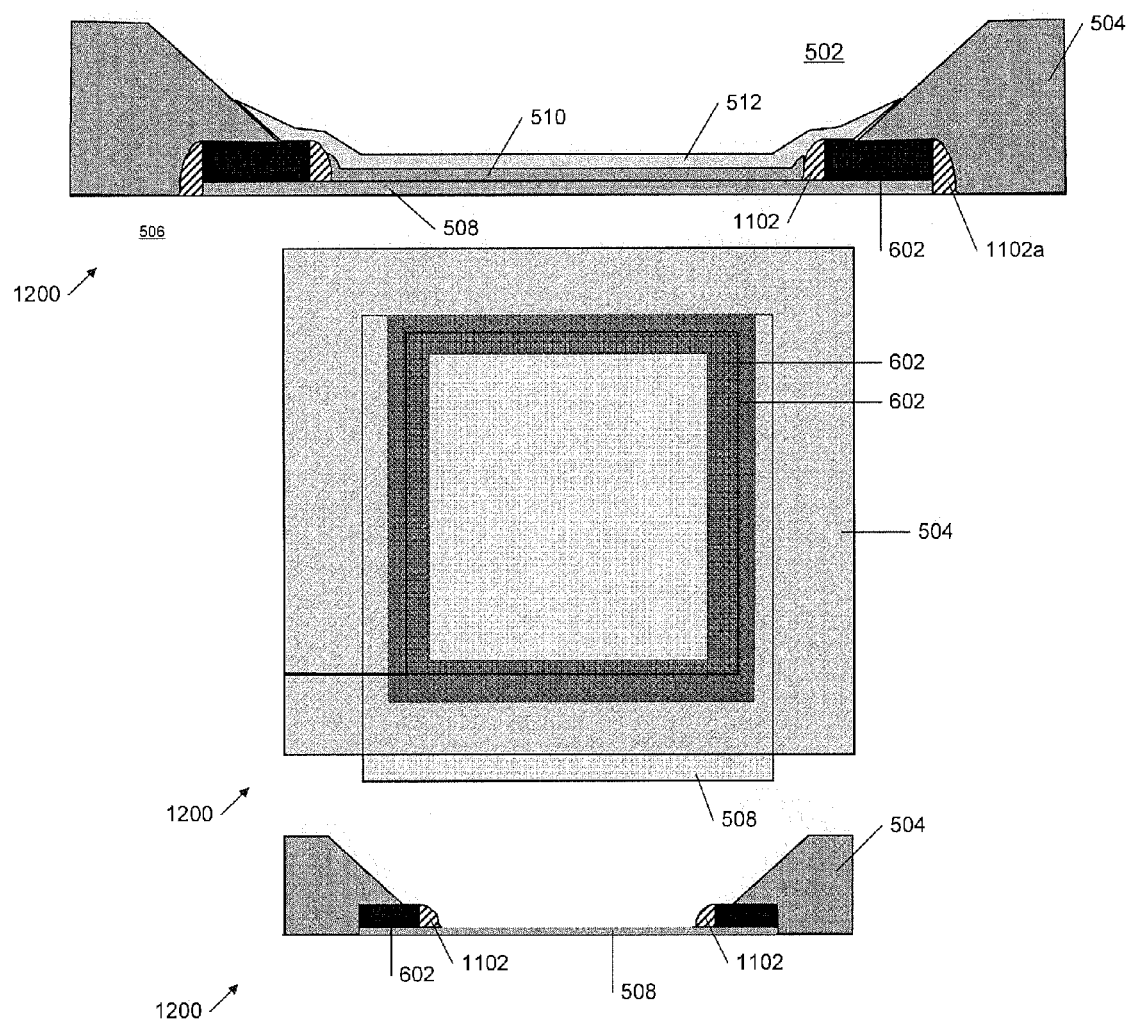
FIG. 12 shows a organic electronic device structure according to a second embodiment of the second aspect of the invention.

FIG. 12 shows a first alternative embodiment of a well structure 1200 in accordance with the second aspect of the invention. Like the embodiment illustrated in FIG. 11, this represents, to some extend an idealised structure. Again fillets 1102 are formed, but in this case the metal step is over rather than under ITO layer 508. As before fillet 1102 provides a "picture frame" around the inside edge at the base of well 502. A feature to note in the embodiment of FIG. 12 is the direct contact between metal 602 and LEP layer 512. This arrangement provides improved robustness to bank alignment because little or no light is emitted from the region of direct contact between the metal and the LEP because of the difference in work functions. Metal 602 should either not be in contact with a hole transport layer such as PEDOT (where present), thus reducing its effectiveness as an anode; and/or should be sufficiently thick so as to be substantially opaque such that any light emitted in the region of contact between metal 602 and the LEP layer is not visible; and/or should have a low workfunction. For opacity metal 602 has a preferred thickness of >30 nm (the precise thickness required for opacity is different for different materials).

Figure 13:
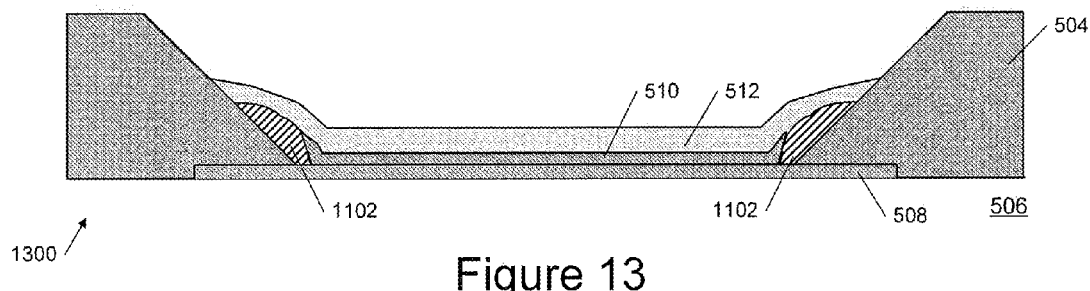
FIG. 13 shows a organic electronic device structure according to a third embodiment of the second aspect of the invention.

FIG. 13 shows a third (idealised) example of a well structure 1300 in which fillets 1102 run up the sloping walls of the well bank layer 504. Structure 1300 may be fabricated, for example, by blanket deposition of spin-on-glass after the positive bank photoresist layer 504 has been spun and photolithographically patterned. The spin-on-glass may then be blanket (unmasked) etched using an anisotropic, preferably dry etch process which removes the spin-on-glass leaving fillets. More generally other low temperature or spin-on-materials may be deposited followed by anisotropic etch-back to form hydrophilic spaces inside the bank resist edges. The embodiment of FIG. 13 has the advantage of taller fillets thus potentially providing improved solvent pinning.

Figure 14:
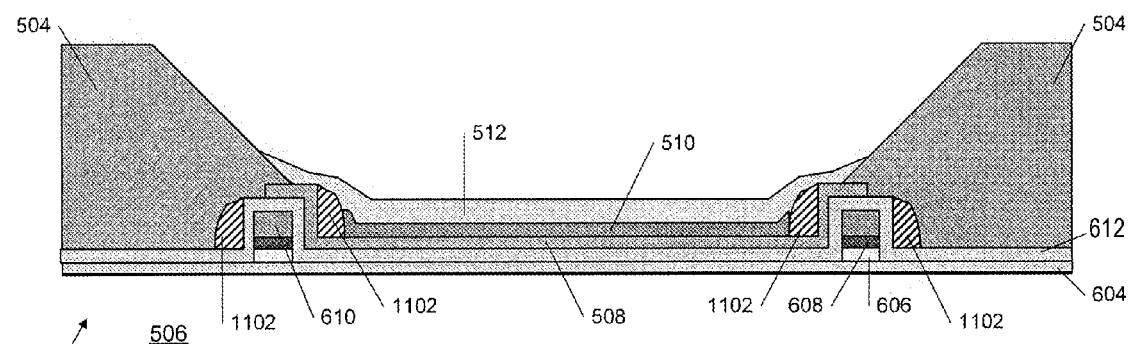
FIG. 14 shows a organic electronic device structure according to a fourth embodiment of the second aspect of the invention.

FIG. 14 shows a further alternative embodiment of a well structure 1400, in which the step layers comprises undoped and doped amorphous silicon layers 606, 608 and the second metal layer 610, in this example, under silicon nitride passivation layer 612 and under ITO layer 508. This structure, with a spacer stack under the ITO layer 508, is potentially able to provide higher step edges and thus a larger fillet surface area and improved PEDOT-bank separation.

Figure 15:
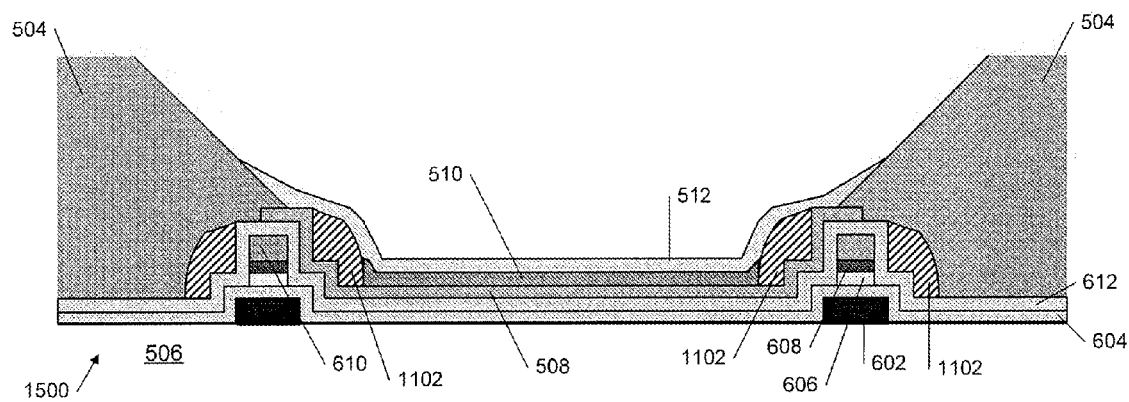
FIG. 15 shows a organic electronic device structure according to a fifth embodiment of the second aspect of the invention.

FIG. 15 shows a further alternative embodiment of a well structure 1500, similar to that shown in FIG. 14, but with a double step formed by the same set of layers as in the FIG. 14 embodiment with the addition of a further step provided by the first metal layer 602, under silicon nitride dielectric layer 604. This provides still taller spacer stack under the ITO layer 508 and thus potentially a still larger surface area of fillet 1102.

Figure 16:
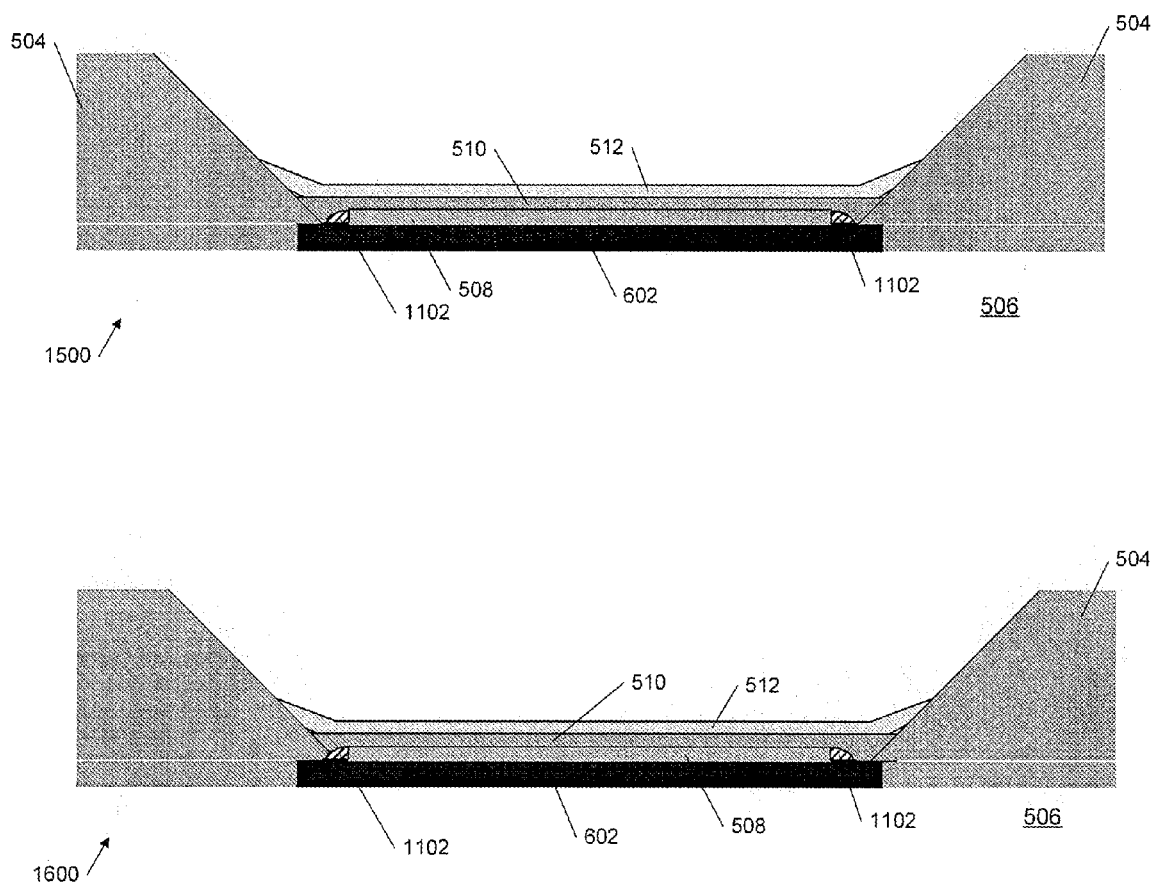
FIG. 16 shows a organic electronic device structure according to sixth embodiment of the second aspect of the invention.

FIG. 16 shows a still further alternative embodiment of a well structure 1600, showing two alternative relative alignments of the tapered bank 504 edge in the structure, illustrating alignment tolerance.

In the structure of FIG. 16 the ITO layer 508 is deposited over one of the metal layers, in the illustrated example the first metal layer 602 and then the self-aligned spacer fillet 1102 is formed around the edges of the (patterned) ITO layer 508. The edge of the tapered bank layer 504 is aligned to the underlying metal layer but need not be accurately aligned to ITO layer 508 since even if the underlying metal layer 602 is exposed because of the mismatch in work functions the diode which is formed is inefficient at emitting light. Thus the emission of the pixel in the structure 1600 of FIG. 16 is essentially determined by the area of the ITO 508, providing an alignment tolerant structure. Nonetheless, as before, the fillet has the effect of pulling the PEDOT-containing solvent out towards to the base of the well sides (and because this will cover the ITO the degree of wetting or otherwise of the bank edge is essentially immaterial because no efficient device is present in the immediate vicinity of the bank edge).

The principle is in some ways similar to that of the FIG. 12 embodiment although in this embodiment a little of the (perimeter of the) pixel area is in effect traded for aligned tolerance. As illustrated, in the first embodiment in FIG. 16, the metal is transparent but is not in contact with PEDOT, and so it may be a high workfunction metal. In the second embodiment of FIG. 16, the metal is transparent and might be in contact with PEDOT due to bank misalignment, which means that the metal layer in this embodiment preferably has a low workfunction to provide a mismatch with the PEDOT.

Referring to FIG. 17, this shows an embodiment of a method of fabricating an OLED device, as illustrated for fabricating a device including a short protruding shelf of hydrophilic material at the base of an "ink-drop" deposition well. The method is also usable, in variants, for fabricating a device with an undercut bank.

Figure 17A:
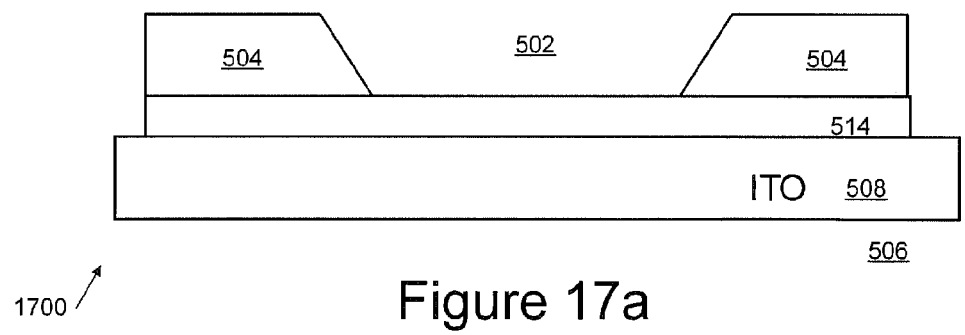
FIG. 17 shows fabrication of a organic electronic device according to an embodiment of an aspect of the invention.
Figure 17B:
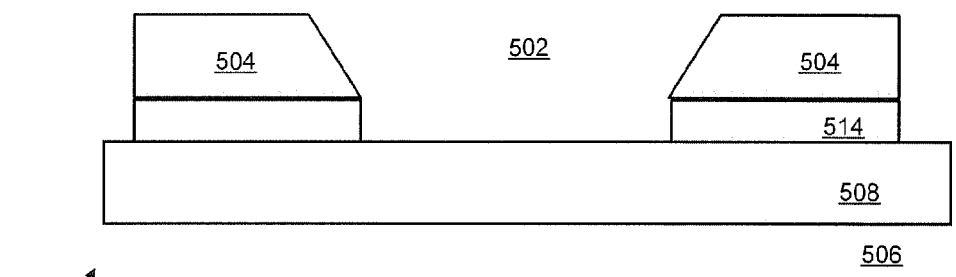
Figure 17C:
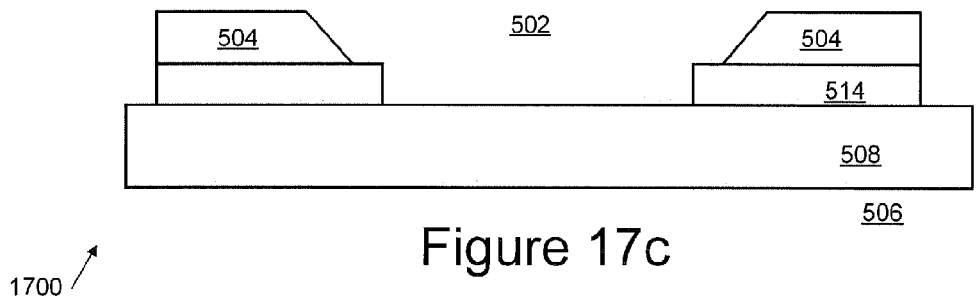

In more detail FIGS. 17a to 17c shows successive stages in fabrication of a well structure 1700 in which, using previously employed reference numerals, a well 502 for a pixel of an OLED display is defined by banks 504 on a substrate 506. The substrate 506 bears a layer of ITO 508 to provide an anode connection for the pixel, over which is deposited an oxide spacer layer 514, and then the bank material, preferably defined in an organic material such as positive photoresist, patterned in a conventional manner, to form banks 504 which taper the substrate as shown in FIG. 17a.

In FIG. 17b an anisotropic dry (plasma gas) etch of the $SiO_2$ layer 514 is performed using bank 504 as mask, to provide a self-aligned etch mask procedure. This is in preparation for fabrication of a projecting step, as shown in FIG. 17c. This creates substantially the same aperture as that defined by the bank material. Alternatively a wet (or dry, plasma) isotropic etch may be performed, to undercut the oxide layer 514, rather than provide straight, vertical edges as shown in FIG. 17b, to fabricate a structure of the general type shown in FIG. 5. In a further alternative a wet (or dry, plasma) isotropic etch may be performed and sufficient bank material removed in the subsequent step, to still leave the projecting step shown in FIG. 17c.

FIG. 17c shows the structure after an $O_2$ plasma ash resist strip step, which reduces the thickness of the bank 504 enlarging the aperture, to expose the edges of the $SiO_2$ layer 514 as shown, so that thinning at the pixel edges does not cause shorting. This step also cleans the oxide and underlying ITO so that it wets well, in preparation for PEDOT solution deposition, followed by LEP deposition.

Embodiments of this method provide a hydrophilic action at the edge of the resist bank pixel well, and allow this to be implemented in a self-aligned, or partially self-aligned, manner without using a separate mask for the oxide layer. Further, if the edge (projecting step or undercut) structure is formed on the side of a layer such as aluminium then that layer can also provide a natural definition of the active pixel, because the diode structure is inefficient when the anode contact is formed with a low work function metal (normally the anode is a high work function metal such as ITO). Embodiments of this method allow standard positive resists to be used (to maintain good step-coverage for the cathode metalisation across the pixel bank edge). Thus the LEP ink can (optionally) be confined based on a surface energy modification treatment process (eg $CF_4$ plasma treatment, as previously mentioned), whilst enabling the de-coupling of PEDT wetting and LEP wetting processes. This allows the surface conditioning process to be tuned for the LEP (potentially enabling better confinement within the pixel resist), whilst the PEDT wetting may be less sensitive to the PEDT contact angle on the resist as it now should rely more or substantially wholly on the hydrophilic or capillary action of the self-aligned pixel edge (projecting step or undercut) structure.

Embodiments of the invention allow the use of positive bank resist and provide advantages over structures we have previously described (ibid), in particular facilitating good metal cathode contact without discontinuity across the pixel edge, and substantially decoupling PEDOT and LEP wetting processes to facilitate adaptation of the structures (for example, surface conditioning) for separate stages of PEDOT and LEP (or other light emitting material) deposition. Moreover embodiments of the structures we have described can be fabricated using self-aligned or partially self-aligned processes, for example without the need for an additional mask/patterning step. Other embodiments achieve alignment tolerance by taking advantage of the inherent inefficiency of a light emitting diode structure when the anode contact is formed with a low work function metal, for example below 4 electron volts and/or without an intervening hole transport layer. Broadly speaking, embodiments of the invention rely on surface energy related techniques to facilitate wetting/pinning of the PEDOT (and LEP) solvents at the sides of a well in which the material is to be deposited.

The above described well structures may be employed in a wide range of solution deposited organic electronic devices. They may be incorporated into either active or passive matrix electroluminescent display devices, or, for example, into a TFT-based active matrix backplane for such a device ready for the deposition of, say, a bank layer and/or organic electronic material.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. An organic electronic device structure, the structure comprising:
   a substrate;
   a base layer supported by said substrate and defining the base of a well, the well containing a solution comprising organic electronic material and a solvent;
   one or more hydrophilic spacer layers formed over said substrate, said hydrophilic spacer layer comprising a hydrophilic material;
   a bank layer formed over said hydrophilic spacer layer to define a side of said well;
   a shelf layer disposed between said spacer layer and said bank layer, said shelf layer comprising a dielectric layer;
   wherein at an edge of said well adjacent said base layer, said hydrophilic spacer layer is recessed relative to said shelf layer such that said shelf layer defines a shelf over said substrate, said shelf defining a recess in which said hydrophilic spacer layer and said solution of said organic electronic material are in contact.

2. An organic electronic device structure as claimed in claim 1 wherein the underside of said shelf is substantially horizontal and spaced away from said substrate or base layer by a distance defined by said one or more spacer layers.

3. An organic electronic device structure as claimed in claim 1 wherein the underside of said shelf is defined by said bank layer.

4. An organic electronic device structure as claimed in claim 1 wherein said shelf layer includes a metal layer.

5. An organic electronic device structure as claimed in claim 1 wherein said hydrophilic spacer layer comprises an oxide and/or nitride of silicon.

6. An organic electronic device structure as claimed in claim 1 wherein said hydrophilic spacer layer comprises doped or undoped silicon.

7. An organic electronic device structure as claimed in claim 1 wherein said bank layer has a thickness which tapers towards said substrate as a said well side is approached.

8. An organic electronic device structure as claimed in claim 1 wherein said bank layer comprises positive photoresist.

9. An OLED display device comprising the structure of claim 1, wherein said base layer comprises an anode layer, wherein said organic electronic material comprises conducting material, and wherein said recess is occupied by a solution of said conducting material.

10. A method of fabricating a organic electronic device on a substrate, the method comprising:
    fabricating one or more base layers on said substrate;
    fabricating one or more hydrophilic spacer layers on said one or more base layers, said hydrophilic spacer layer comprising a hydrophilic material;
    depositing a shelf layer over said hydrophilic spacer layer, said shelf layer comprising a dielectric layer;
    depositing bank material over said shelf layer;
    etching said hydrophilic spacer layer such that said hydrophilic spacer layer is recessed relative to said shelf layer and said shelf layer defines a shelf over said substrate, said shelf defining a recess, said well being adapted to retain liquid;
    depositing a solution comprising an organic electronic material and a solvent into said well such that said solution of organic electronic material contacts said hydrophilic spacer layer in the recess; and
    evaporating the solvent.

11. A method as claimed in claim 10 wherein the underside of said shelf is substantially horizontal and spaced away from said base layer by a distance defined by said one or more spacer layers.

12. A method as claimed in claim 10 wherein said etching comprises at least partially self-aligned etching of said well and said recess.

* * * * *